(12) United States Patent
Stellari et al.

(10) Patent No.: US 7,378,859 B2
(45) Date of Patent: May 27, 2008

(54) SYSTEM AND METHOD FOR ESTIMATION OF INTEGRATED CIRCUIT SIGNAL CHARACTERISTICS USING OPTICAL MEASUREMENTS

(75) Inventors: Franco Stellari, Ho Ho Kus, NJ (US); Alberto Tosi, Invorio (IT); Peilin Song, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 289 days.

(21) Appl. No.: 11/049,324

(22) Filed: Feb. 2, 2005

(65) Prior Publication Data
US 2006/0168793 A1    Aug. 3, 2006

(51) Int. Cl.
*G01R 31/00* (2006.01)
(52) U.S. Cl. ...................... 324/752; 324/765
(58) Field of Classification Search ......... 324/750–752, 324/765; 382/145–150; 702/117; 250/559.07; 348/79
See application file for complete search history.

(56) References Cited

U.S. PATENT DOCUMENTS

| | | | | |
|---|---|---|---|---|
| 4,477,775 A | * | 10/1984 | Fazekas | 324/751 |
| 4,680,635 A | * | 7/1987 | Khurana | 348/79 |
| 5,430,305 A | * | 7/1995 | Cole et al. | 250/559.07 |
| 5,598,100 A | * | 1/1997 | Maeda et al. | 324/501 |
| 5,940,545 A | | 8/1999 | Kash et al. | |
| 6,078,183 A | * | 6/2000 | Cole, Jr. | 324/752 |
| 6,737,880 B2 | * | 5/2004 | Samaan et al. | 324/765 |

OTHER PUBLICATIONS

A. Tosi, F. Stellari, F. Zappa, S. Cova, Backside Flip-Chip testing by means of high-bandwidth luminescence detection, Microelectronics Reliability 43, 2003, pp. 1669-1674, Elsevier LTD.
F. Stellari, F. Zappa, S. Cova, L. Vendrame, Tools for Non-Invasive Optical Characterization of CMOS Circuits, STMicroelectronics, 1999 IEEE, pp. 487-490, Milano-Italy.
A. Tosi, F. Stellari, F. Zappa, S. Cova, Hot-carrier luminescence: comaprison of different CMOS technologies, 2003 IEEE, pp. 351-353, Milano (Italy).
E. Menzel and E. Kubalek, Fundamentals of Electron Beam Testing of Integrated Circuits, Scanning vol. 5, 1983, pp. 103-122, FACM Publishing Inc.
J.C. Tsang, J.A. Kash, Picosecond hot electron light emission from submicron complementary metal-oxide-semiconductor circuits, American Institute of Physics, Feb. 17, 1997, pp. 889-891, vol. 70 No. 7.

(Continued)

*Primary Examiner*—Vinh P Nguyen
(74) *Attorney, Agent, or Firm*—Keusey, Tutunjian & Bitetto. P.C.; Anne V. Dougherty, Esq.

(57) ABSTRACT

Systems and methods for making electrical measurements using optical emissions include positioning a sensor/photo-detector to measure radiation emissions from devices to be tested. Radiation emission information is collected from the device to be tested during electrical operation. Characteristic features of the radiation emission information are determined, and differences between the characteristic features are deciphered. Based on the differences, models are employed to determine electrical properties of the device, especially operational characteristics.

10 Claims, 9 Drawing Sheets

OTHER PUBLICATIONS

S. Polonsky, A. Weger, M. McManus, Picosecond Imaging Circuit Analysis of Leakage Currents in CMOS Circuits, Proceedings from the 28th International Symposium for Testing and Failure analysis, Nov. 2002, pp. 387-390, Phoenix, Arizona.

S. Tam, C. Hu, Hot-Electron-Induced Photon and Photocarrier Generation in Silicon MOSFET's, IEEE Transactions of Electron Devices, vol. ED-31, No. 9, Sep. 1984, pp. 1264-1273.

T. Eiles, G. Woods, V. Rao, Optical Probing of Flip-Chip-Packaged Microprocessors, 2000 IEEE International Solid-State Circuits Conference, TD: Low Temp, Circuits & Diagnostic Techniques, 2000, pp. 220-221, Session 13.

* cited by examiner

100

SYSTEM AND METHOD FOR ESTIMATION OF INTEGRATED CIRCUIT SIGNAL CHARACTERISTICS USING OPTICAL MEASUREMENTS

BACKGROUND

1. Technical Field

The present invention relates to extracting characteristics of electrical signals for integrated circuit devices, and more particularly measuring switching speed, transition states and times between the transition states of the integrated circuit devices using optical techniques.

2. Description of the Related Art

It is very difficult to have access to electrical signals inside Integrated Circuits (IC) with conventional testing techniques. High numbers of metal layers, ultra-scaled dimensions of transistors and interconnections and flip-chip packages all prevent known testing methods from non-invasively measuring the internal electrical signal characteristics.

Picosecond Imaging Circuit Analysis (PICA) permits the testing of internal signals through the spontaneous emission originating from the switching activity of metal oxide semiconductor (MOS) transistors, collected from the backside of the circuit. However, the direct non-invasive measurement of the slew rate (i.e., the slope) of electrical signals is still not possible with PICA or other non-invasive conventional methods.

Several conventional testing techniques can measure the electrical signals inside integrated circuits, but all of these techniques are either invasive or cannot access all the signals. Mechanical testing makes use of mechanical probes to directly measure the electrical signals from chip interconnections or from dedicated test pads. The main drawbacks include invasiveness (e.g., mechanical probes cause a capacitive and resistive load of circuit nodes and perhaps physical damage). The mechanical probing can be used only for the top-level metals of the chip.

Electron Beam Tester (EBT) can analyze electrical signals inside an integrated circuit (IC) thanks to a scanning electron beam. The limitations for EBT include limited access to only the top-level metals of the chip and the inferior time and amplitude resolutions, which do not permit extraction of quantitative information regarding the slew rate of electrical signals.

Laser Voltage Probe (LVP) can access the signals from the backside of the chip but the laser invasiveness prevents the applicability of this technique to SOI (Silicon-On-Insulator) technologies. Moreover, the amplitude resolution is not sufficient for accurate slew rate estimations.

SUMMARY

Systems and methods for making electrical measurements using optical emissions include positioning a sensor/photodetector to measure radiation emissions from a device to be tested. Radiation emission information is collected from the device to be tested during electrical operation. Characteristic features of the radiation emission information are determined, and differences between the characteristic features are deciphered. Based on the differences, models are employed to determine electrical properties, especially operational properties, such as for example the switching time or slew rate of the device.

These and other objects, features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
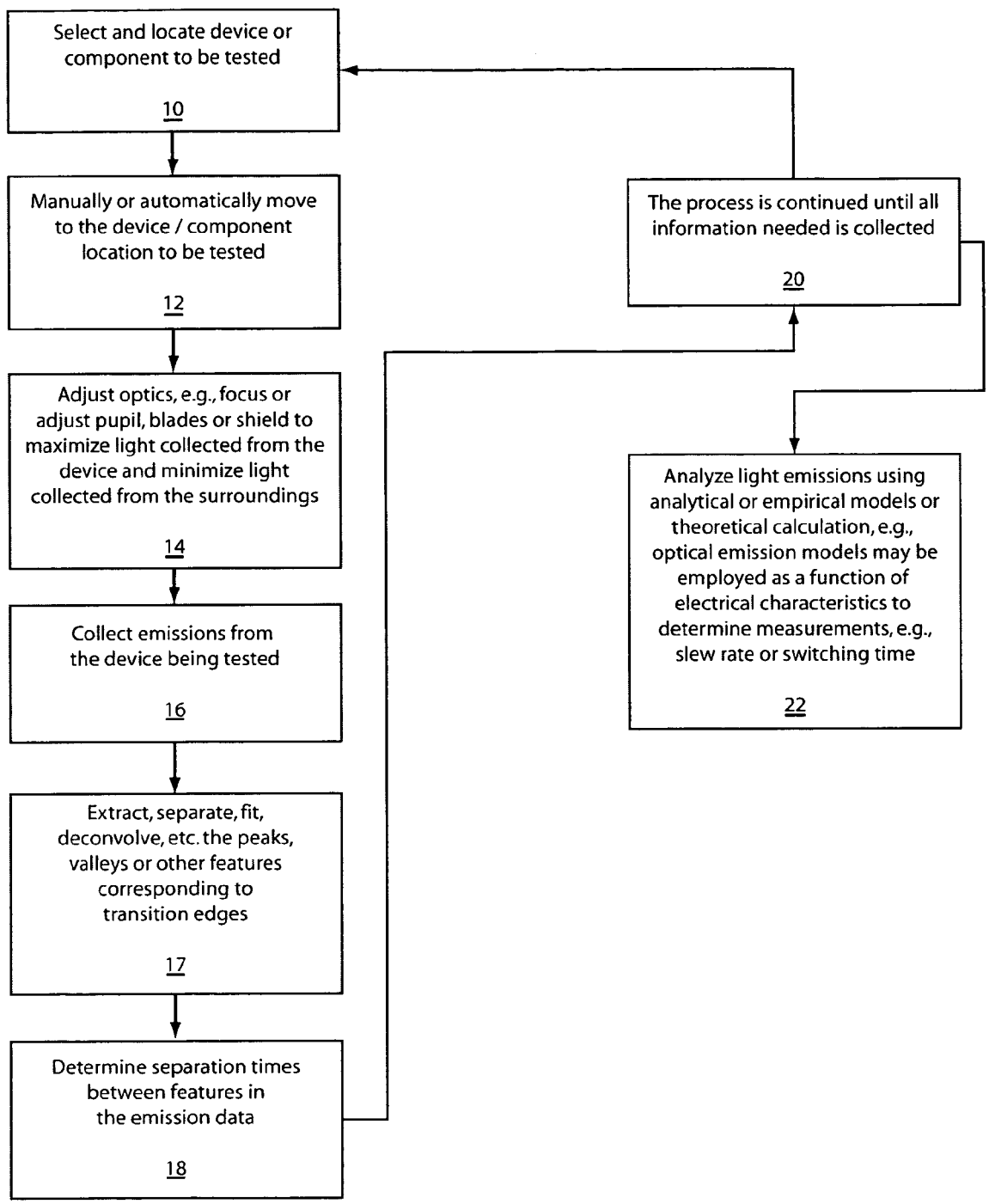
FIG. 1 is a block/flow diagram showing a system/method for measuring electrical characteristics of a device using optical measurements in accordance with an illustrative embodiment.

Systems and methods are presented for extracting and/or measuring characteristics of integrated circuits devices using optical techniques. In one illustrative example, a 10%-90% switching time of a gate (or the slew rate of an electrical signal) is measured by a time-dependent optical measurements (e.g., using Picosecond Imaging Circuit Analysis (PICA) or other optical methods) and/or optical simulations based on, e.g., a luminescence model integrated in a simulator. PICA is illustratively described in, commonly assigned U.S. Pat. No. 5,940,545, to Kash et al., incorporated herein by reference.

The simulator may include a software program such as, for example, SPICE™ circuit simulator with a luminescence or other optical model integrated therein. Embodiments of the present disclosure may be implemented in a commercial software tool, for example, integrated into a PICA tool as a feature to help/enhance circuit diagnostics and test.

To demonstrate aspects of exemplary embodiments, an illustrative example will now be described. In an integrated circuit, when an input voltage IN of an inverter switches from high to low, a p-FET emits a light pulse (just after or about at the same time the IN voltage crosses the threshold voltage of the p-FET) and then an n-FET emits another light pulse (just before or about the same time the IN voltage crosses the threshold voltage of the n-FET). By the present embodiments, it is possible to measure these two distinct light flashes by means of a high sensitivity detector with high time resolution and measure the time distance between the two peaks.

To extract the slew rate, for example, of the on-chip electrical signal feeding a gate under test, the systems/method provides at least:

1) the evaluation of the time separation between the switching pulses of the n-FET and p-FET of the gate corresponding to the signal transition (low to high or high to low) to measure the slew rate or switching time;

2) the use a compact/analytical model of the emission as a function of the electrical bias to convert the time separation of the measured optical peaks to a slew rate value. This extraction is based on either a SPICE-like circuit simulation or analytical models; and/or 3) the use of a tool (e.g., implemented in software) that can convert the peaks separation into a slew rate value on the basis of a calibration curve or starting from technology depending parameters.

The concept takes advantage of the different switching characteristics (switching time) of the n-FET and the p-FET of a gate. From the theory and modeling of the emission probability, the time separation of the n-FET and p-FET switching pulses depends strongly on the time needed to switch state low to high (or high to low), which is the slew rate of the input signal or the gate switching time. With a model of the emission and simple calculations, it is possible to evaluate the slew rate after the estimation of the luminescence peaks separation.

In one practical implementation in a commercial tool, some software aids may be considered. For example, automatic physical localization of the n-FET and p-FET of the gate under test based on the layout information may be performed. Optimization of the collection from the n-FET and p-FET may also be performed to maximize the emission collected from the transistor of interest and minimize the stray light from neighboring transistors. Automated closing of blades (a pupil) may be employed to stop light from neighboring devices, based on for example, an optical collection area calculation.

Software that permits the precise extraction of small peak separations may be employed for fitting or convolution algorithms. Correlation of the data with the emission model may be utilized to estimate switching time or slew rate of the signal or any other characteristics to be measured.

As discussed above, the present disclosure employs the illustrative example of an inverter gate to set forth some of the principles and concepts of preferred embodiments. The present disclosure should not be construed as limited to these examples as embodiments may be directed to other circuitry, components and/or integrated circuit devices which provide electromagnetic radiation emission or lack thereof during operations.

It should be understood that the elements shown in FIGS. may be implemented in various forms of hardware, software or combinations thereof. Preferably, these elements are implemented in a combination of hardware and software on one or more appropriately programmed general-purpose digital computers having a processor and memory and input/output interfaces.

Referring now to the drawings in which like numerals represent the same or similar elements and initially to FIG. 1, a block/flow diagram shows a system/method for measuring characteristics, e.g., slew rate, for a device or devices on an integrated circuit. In block 10, a gate or device under test is located. This may be performed as part of a manufacturing test program or may be performed to gather data on individual devices. Devices may be selected in a variety of ways, for example, spot checks for a device at a same location on each of a plurality of semiconductor chips may be performed, or a selected gate may be tested as a result of historic problems based on reliability data, or a series of devices may be selected along a critical path, or based on previously collected electrical and optical information. Others selection techniques may also be employed and are contemplated by the present disclosure.

Selected devices may be located in accordance with an integrated circuit layout by means of one or more mapping techniques. For example, a position of a device may be entered into a program, which drives, e.g., a motorized micropositioning stage to appropriately position an optical sensor/photodetector for collecting electromagnetic emissions from the selected device or devices. Devices on a chip may be cross-references or tracked based on computer aided design layouts of other digital records.

In block 12, the optical sensor/photodetector, for example, a PICA-like optical sensor/photodetector (with single-point or imaging capability) is manually or automatically positioned over the device under test. In this example, the device includes an inverter gate (see e.g. FIG. 2) where the n-FET transistor or p-FET of the gate is tested first. It may be preferable to start with the n-FET because it is brighter and data is easier to acquire.

The optical sensor/photodetector may be adjusted in block 14 once the device to be tested is located. This may include for example, adjusting focus, adjusting a pupil or other light excluding apparatus, such as for example, blades, which shield light from other sources but maximize light from the desired source. In the example, the desired source at this juncture is the n-FET device and the p-FET device in the inverter gate (see FIG. 2).

In block 16, emissions are collected from the desired source. Metal oxide semiconductor (MOS) transistors emit near-infrared photons during the switching activity of logic gates. In addition, sub-micron complementary MOS (CMOS) technologies present light emission related to static off-state leakage currents. For MOS transistors where carriers pass through a high electric field, there is spontaneous light emission of near-infrared photons. The optical sensor/photodetector may collect this radiation with a broad spectrum from about 800 nm to about 1700 nm.

Luminescence emission is present in both n-FET and p-FET transistors, although the emission probability and the spectra are different (e.g., lower for p-FETs). During a switching activity, the conditions at which each transistor (n-FET and/or p-FET) has the highest emission (e.g., peaks), occur at different times.

In block 17, barycentres, centroids or other calculated or estimated positions relative to the emission as a function of time are determined to provide one or more points from which measurements may be made.

For example, use of a software program or hardware instrumentation may be employed to extract, separate, fit and/or deconvolve the peaks, valleys or other features of the optical emission data collected for the one or more devices. For example, peaks may be determined for different devices followed by an analysis of rising and falling edges of the signals between the same or different devices.

Then, in block 18, an estimate of elapsed time between events or the durations of events can be determined and evaluated by measuring distances between peaks or other features. These peaks or other information collected from the emission information may be analyzed and used to make measurements or to otherwise characterize or compare one or more devices. The separation between peaks is determined preferably using software related tools.

In block 20, the process is continued by selecting and moving to another device or taking data from the same on one or more emissions (e.g., for different transitions). Measurements are continued until data is collected from all of the devices or components needed to make the desired measurements.

In block 22, when the needed information is collected, an analysis of the emission data is performed. This may include using a compact or analytical model of the emission data as a function of the electrical characteristics or bias to convert the time separation of the measured optical features (e.g., peaks) to a usable measurement, such as slew rate, switching time, etc. This may be implemented using a program implementation such as an addendum to a SPICE™ circuit simulation program or the like. In an alternate embodiment, an analytical or empirical model may be employed, for example, a calibration curve. In yet another embodiment, parametric data may be employed to determine the measurements. To illustrate, consider, for example, an inverter (NOT) gate 100 as depicted in FIG. 2.

Figure 2:
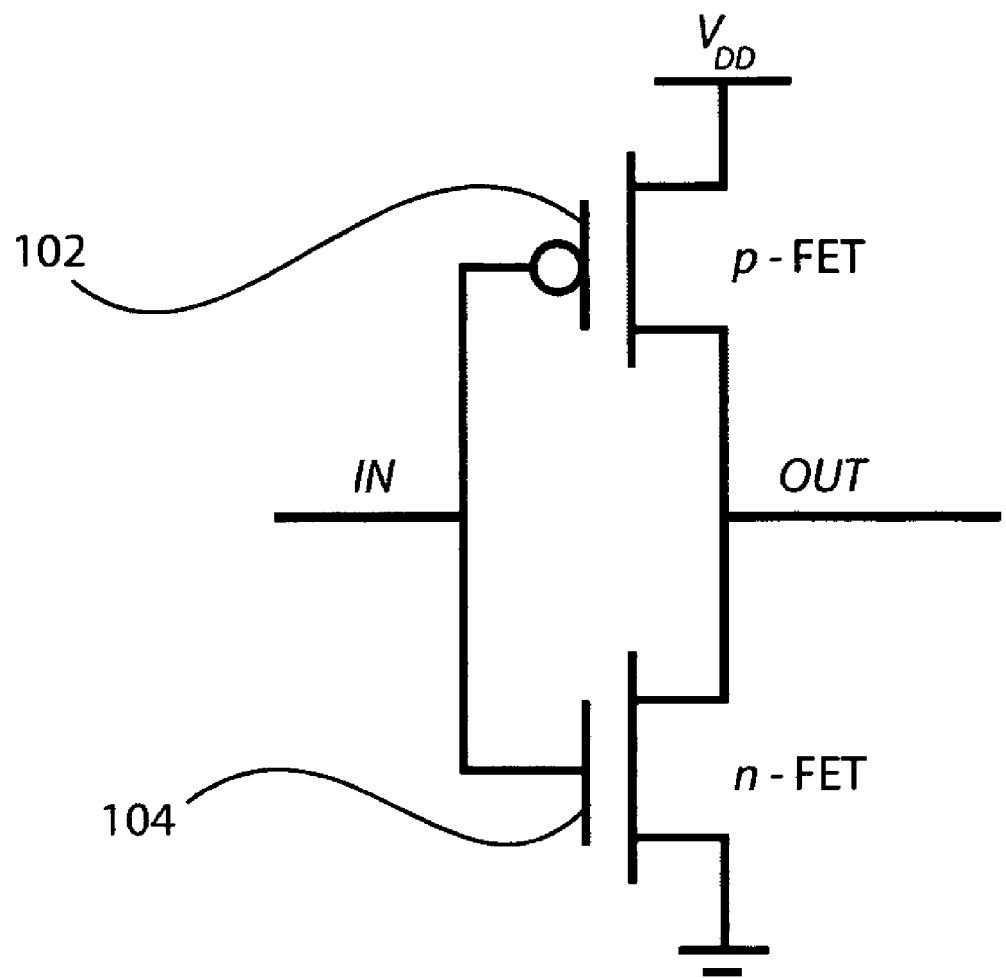
FIG. 2 is a schematic diagram of a gate (e.g., a NOT inverter) used to illustrate measurements in accordance with one exemplary embodiment.
Figure 3:
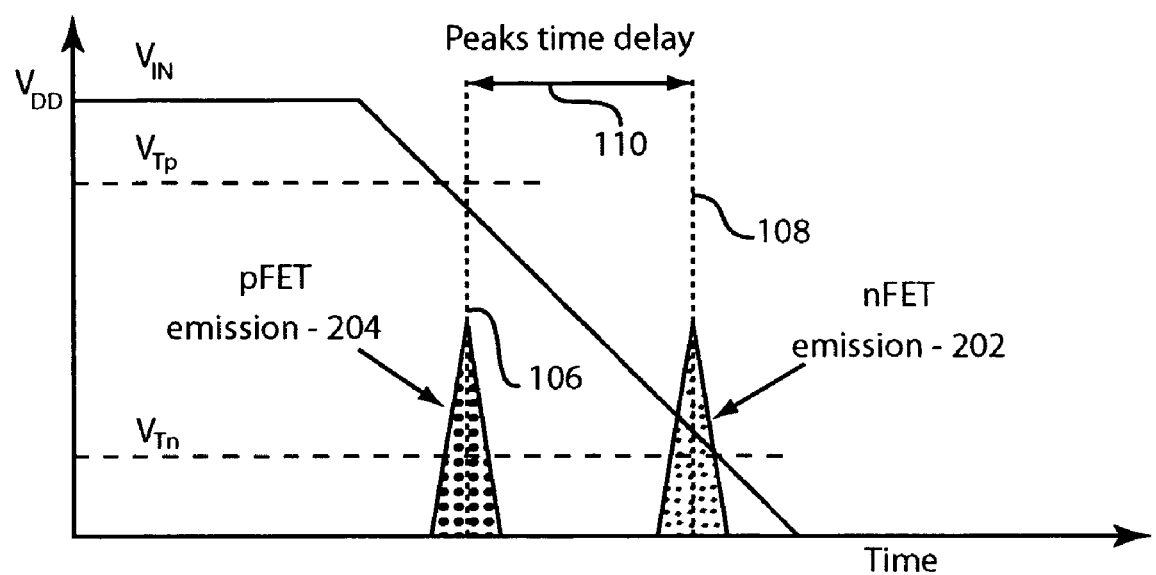
FIG. 3 is a voltage versus time diagram showing optical emission peaks for different devices in FIG. 2 during a falling input voltage ($V_{IN}$) signal to determine slew rate during device operation.

Referring to FIGS. 2 and 3, a measurement of an n-FET emission 202 and a p-FET emission 204 are illustratively shown for measurements taken during the operation of inverter 100.

When the input signal (IN) ("IN", FIG. 2, Vin, FIG. 3) switches from a high state (for example the supply voltage, $V_{DD}$) to a low state (for example ground GND), with a certain slew rate, first the p-FET transistor 102 reaches a condition at which there is high photon emission (this time position can be precisely calculated by means of the emission model, but it roughly takes place just after the input signal ($V_{IN}$) crosses a the p-FET threshold (e.g., threshold voltage $V_{Tp}$) for a simple inverter gate). Then, after a certain amount of time, an n-FET 104 reaches a condition at which there is a high photon emission (again this time position can be precisely calculated by means of the emission model, but it roughly takes place just before the input signal crosses the n-FET threshold (e.g., threshold voltage $V_{Tn}$) for a simple inverter gate).

Measuring both optical waveforms from both n-FET 104 and p-FET 102, it is possible to see different peaks (Peaks time delay 110) with barycentres 106 and 108 located at different times.

Figure 4:
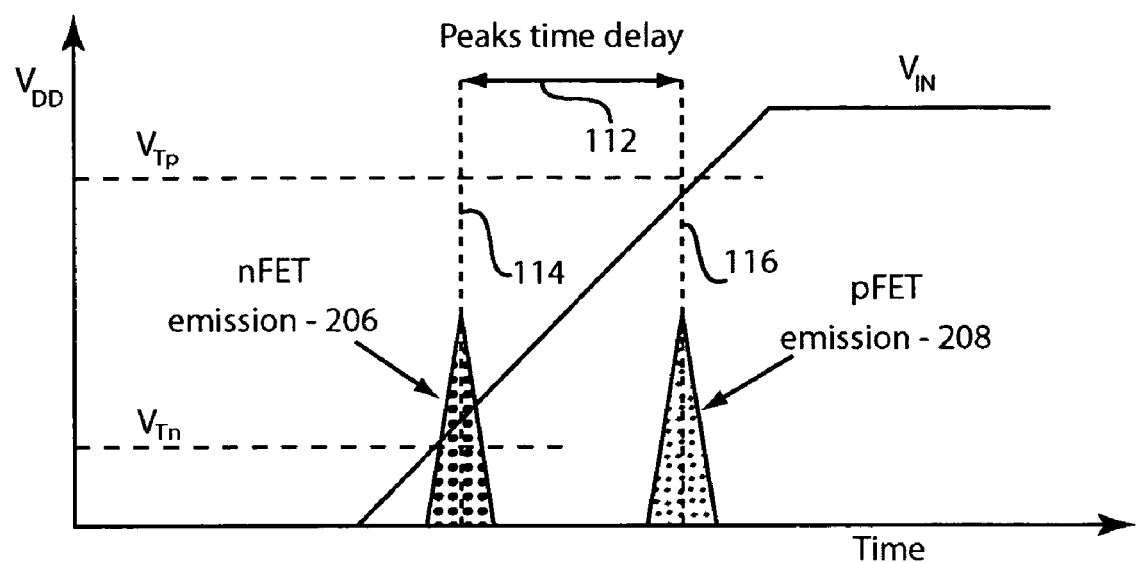
FIG. 4 is a voltage versus time diagram showing optical emission peaks for different devices in FIG. 2 during a rising input voltage ($V_{IN}$) signal to determine slew rate during device operation.

Referring to FIG. 4 with continued reference to FIG. 2, when the input signal ("IN", FIG. 2, $V_{IN}$, FIG. 4) switches from the low state (for example ground GND) to the high state (for example, the supply voltage, $V_{DD}$), with a certain slew rate, first the n-FET transistor 104 reaches a condition at which there is high photon emission (this time position can be precisely calculated by means of the emission model, but it roughly takes place just after the input signal crosses the n-FET threshold $V_{Tn}$ for a simple inverter gate). Then, after a certain amount of time, also the p-FET 102 reaches a condition at which there is high photon emission (this time position can be precisely calculated by means of the emission model, but it roughly takes place just before the input signal crosses the p-FET threshold $V_{Tp}$ for a simple inverter gate).

Measuring both optical waveforms for the n-FET emission 206 and the p-FET emission 208 in a PICA-like mode from both n-FET 104 and p-FET 102, it is possible to see different peaks with barycentres 114 and 116 located at different times (Peaks time delay 112).

Figure 5:
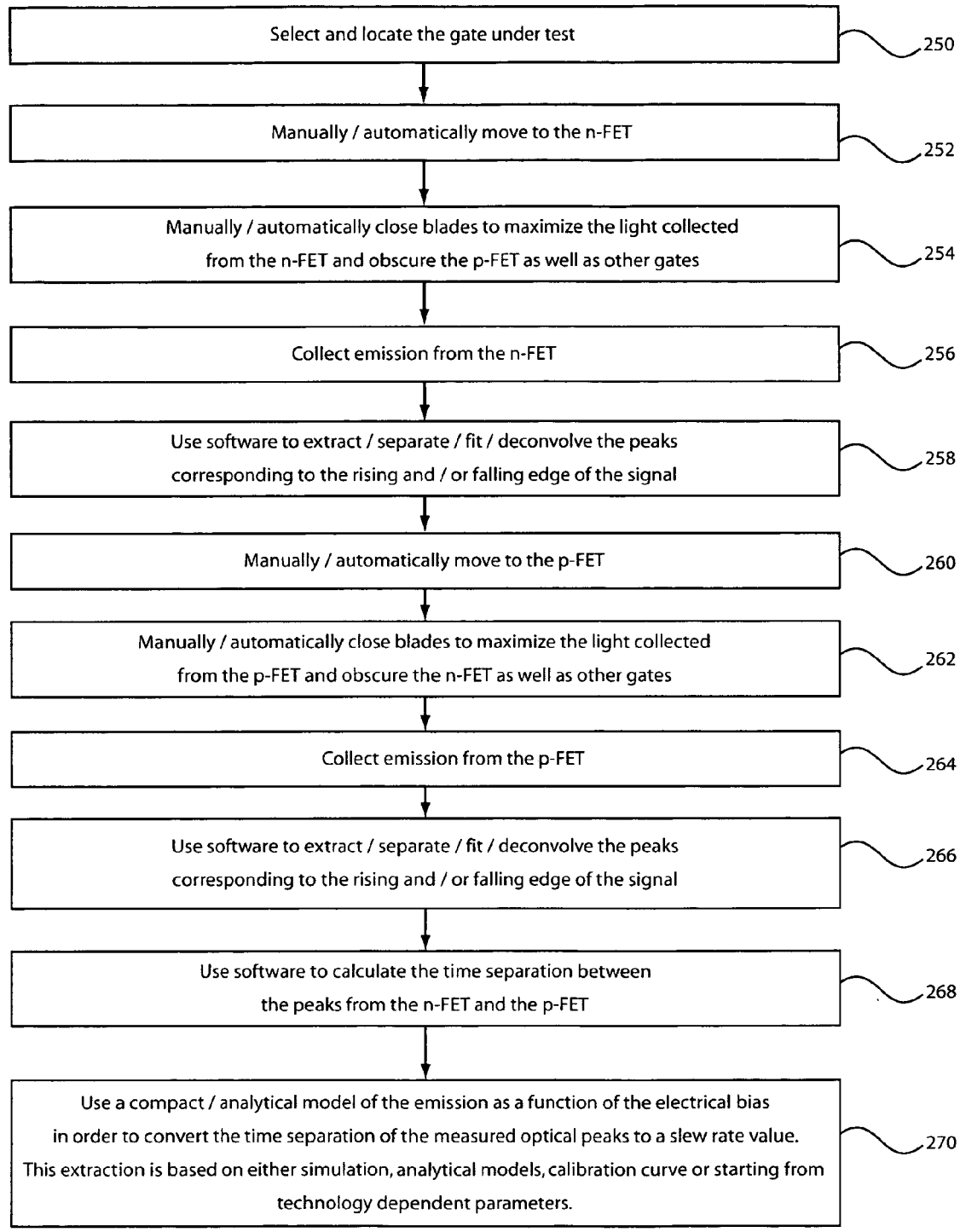
FIG. 5 is a block/flow diagram for a method for optically testing a gate to measure switching time and/or slew rate.

It is to be understood that while FIGS. 3 and 4 show emission peaks as triangular shaped regions, these emission peaks generally are Gaussian distributions (see FIG. 5, for example). The emission peaks may take many forms and measurement points may be selected and varied according to specific applications.

To get a precise extraction of the emission peaks' separation compared to the slope of the electrical signal, accurate simulation using an emission model may be performed. For example, a SPICE circuit simulation program or the like may be employed to analyze or simulate emission waveforms.

Referring to FIG. 5, the method for measuring slew rate and/or switching times for a gate (e.g., in FIG. 2) is set forth for a particularly useful embodiment. In block 250 the gate under test is selected and located. In block 252, the photodetector or the chip (or both) are moved manually or automatically to a particular device. For illustrative purposes the n-FET is tested first in this example.

In block 254, blades are closed manually or automatically to maximize light from the nFET and minimize light from other sources (e.g., p-FET). In block 256, emissions are collected from the n-FET.

In block 258, the emission peaks are deciphered (extracted, separated, fitted, deconvolved) corresponding to portions of the electrical signals. This is preferably performed using software programs, which may be commercially available to analyze emission waveforms. In blocks 260, 262, 264 and 266, the procedure is repeated for the p-FET as described for the n-FET in blocks 252, 254, 256 and 258.

In block 268, distance (time separation) between portions of the emission waveforms are determined. For example, emission peaks between the n-FET and the p-FET may be measured. This may be performed using software. In block 270, compact/analytical model(s) of the emission as a function of electrical transitions or bias are used to convert the time separation of the measured optical peaks to a slew rate or switching time. This extraction may be based on simulation, analytical model, calibration curve or starting from technology dependent parameters.

Figure 6:
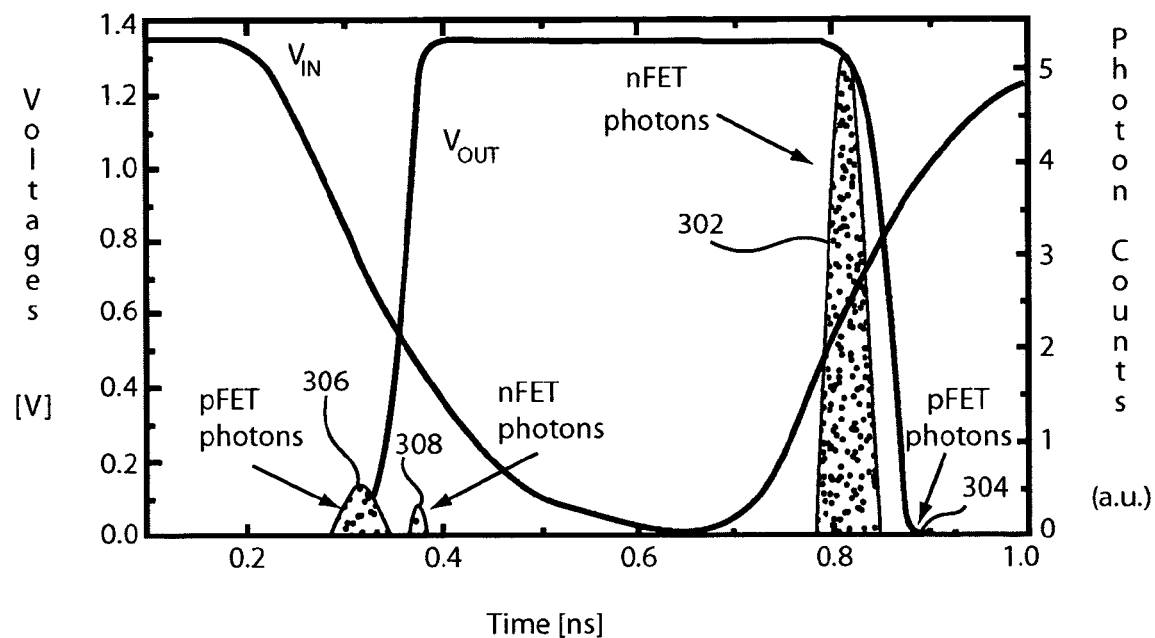
FIG. 6 is a diagram showing events and simulated waveforms for the operation of devices shown in FIG. 2 during an entire cycle of the input signal from high to low and then high again.

Referring to FIG. 6, a simulation of emission waveforms is illustratively shown for an inverter gate 100 as depicted in FIG. 2 showing a complete cycle for input signal IN going from high/Vdd to low/GND and the high/Vdd again; and the n-FET and p-FET optical responses based on photon counts overlaid on the output response OUT over time.

During the switching (IN from high to low), there is first an emission peak 306 for the p-FET and then a peak 308 for the n-FET. During the low-to-high switching of the IN signal, there is a first emission peak 302 of the n-FET and then a peak 304 for the p-FET.

The position (barycentre) of the peaks can be exploited to evaluate the slew rate of the input (IN) signal. The relationship between the peaks positions and the slew rate can be extracted either from accurate simulation of the luminescence or by means of analytical equations.

For example, using a luminescence model (e.g., a model that describes the amount of photons emitted for every MOSFET working condition) it is possible to calibrate the relationship between the peaks separation and the slew rate of the input signal.

Figure 7:
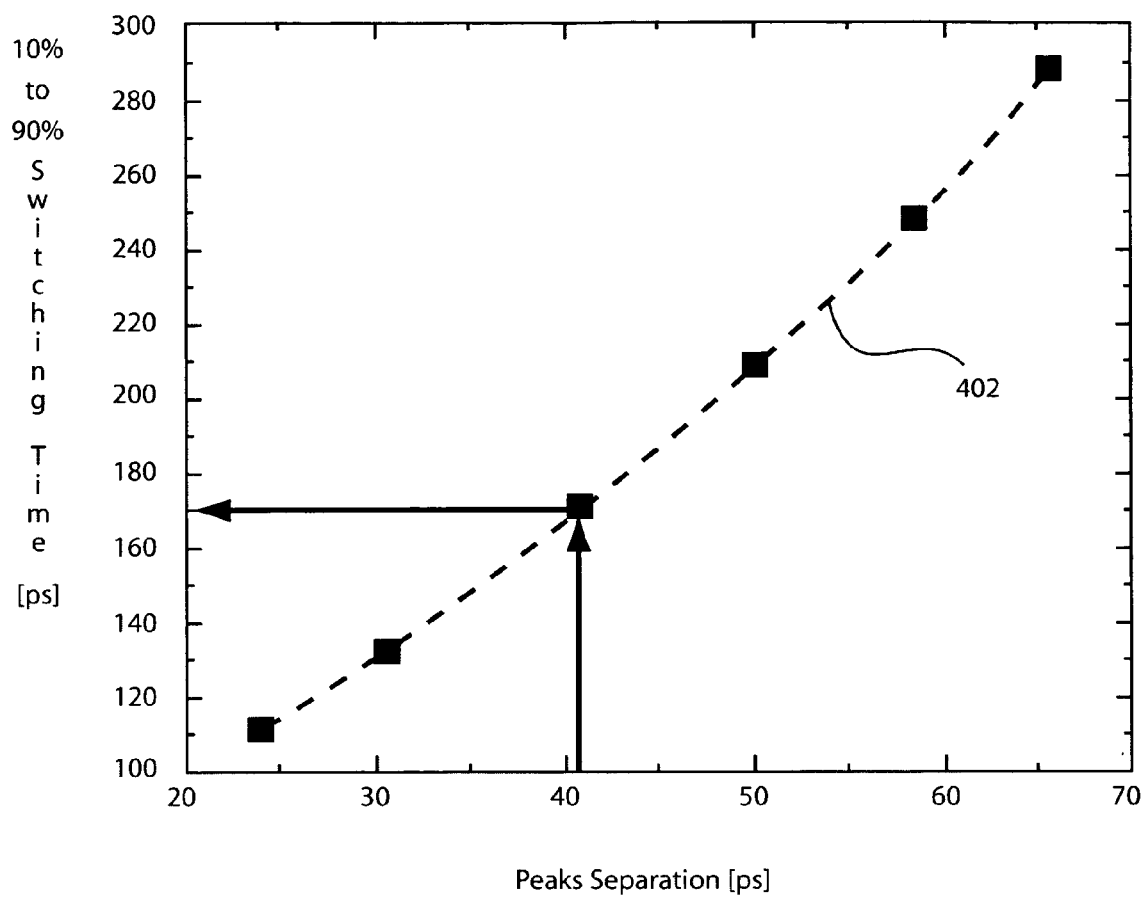
FIG. 7 is an illustrative characterization curve or model demonstrating peak separation dependence on the slew rate for waveforms.

FIG. 7 shows an example of this kind of calibration. A relationship between peak separation and slew rate (switching time) is determined (curve 402). This may be determined empirically or analytically and is not limited to the slew rate, as in this example. Other transitions and responses may be measured using the methods and systems described herein.

In this example, for each luminescence peak distance (peak separation [ps]), the corresponding slew rate (10%-90% switching time [ps]) may be determined. As qualitative information, the more distant the peaks are from each other, the lower/smaller/slower the slew rate (the slew rate is a speed of transition and therefore it goes in the opposite way than the switching time) and the higher the switching time. These can be calculated accurately without invasive measurement.

Figure 8:
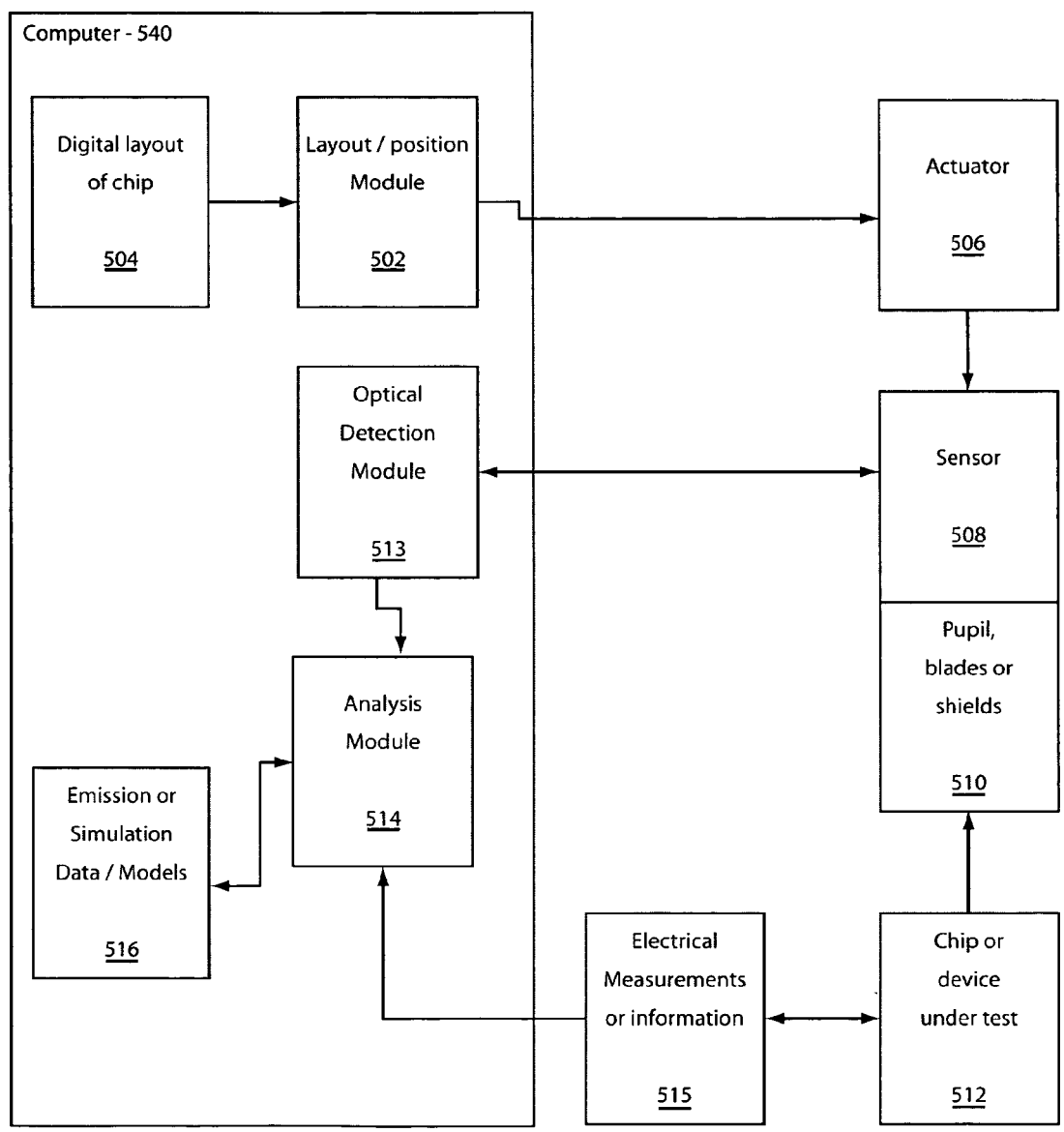
FIG. 8 is a block diagram showing an illustrative system for analyzing and/or making measurements on a device under test.

Referring to FIG. 8, a block diagram of an optical measurement system 500 is illustratively shown in accordance with one illustrative embodiment.

In preferred embodiments, software code can be implemented on a computer 540 or computer like tool to perform location, measurement, analysis and record keeping tasks. In one particularly useful embodiment, system 500 includes a PICA-like tool, which may be equipped with a layout/position module 502 to locate a device or component on a chip or device under test 512 in accordance with address data or a digital layout 504 of the chip (e.g., CAD drawings). Module 502 provides an actuator or actuators 506 with positioning information to properly position a sensor/photodetector 508, the chip 512 or both.

Sensor 508 includes a pupil, blades or shields 510 which are adjustable to maximize light from a particular device, e.g., a FET, and exclude light from surrounding devices or the environment. Optical data is collected by sensor 508 and delivered to an optical detection module 513, which records the data as a function of time. Optical detection module 513 provides the optical data to an analysis module 514, which associates the optical data with electrical events (e.g., low to high or high to low transitions for given electrical signals). Electrical signals may be deciphered from the optical data, provided directly by measurement (module 515). Module 515 may measure or simulate electrical data from chip 512 and correlate the electrical data with the optical data using time information.

For example, when the OUT voltage in FIG. 1 switches from low to high, the light emission due to off-state leakage current of the n-FET also switches from low to high, and the shape of the slope in the emission waveform is correlated to the shape of the slope in the electrical waveforms, especially when the IN signal is slower than the OUT signal. By means of either optical simulations or analytical equations it is possible to calculate the slew rate of the electrical signals from the slopes of both the n-FET and the p-FET leakage emission waveforms.

Module 514 then calculates distances between optical events and uses this data to compare with models (block 516) to measure a characteristic of a device or devices.

For example, the software code may extract the slew rate or the switching time of the gate under test from the emission peaks' distance. The conversion from peak separation to the slew rate can be made on the basis of a calibration curve or of an equation model taking into account the technology parameters.

Since the p-FET and the n-FET in the given example are often very close to each other, it could be useful to limit the field of view of a single-pixel photodetector (sensor) during the measurements onto only either the n-FET or the p-FET. This may be performed by using the pupil or blades to shield out unwanted emissions. In this way, it is easy to avoid unwanted influences of the other FET during measurements to improve the signal-to-noise ratio and the peaks detectability. In one embodiment, when using an imaging detector (sensor), the emission from both n-FET and p-FET can be acquired in parallel, thus reducing the number of measurements.

In one embodiment, overlaying a computer aided design (CAD) layout of the circuit onto an LSM (Laser Scanning Microscope) image, the software can localize the device under test and close the field of view only onto the n-FET or the p-FET or any other device.

If the chip under test is affected by high leakage current, it has also a high light emission from the static off-state leakage current. The slopes marking the changes from high levels to low levels (and vice versa) of light emission due to leakage current can be exploited to extract further information.

For example, using either optical simulations or analytical equations it is possible to calculate the slew rate of the electrical signals from the slopes of both the n-FET and the p-FET leakage emission waveforms.

Figure 9:
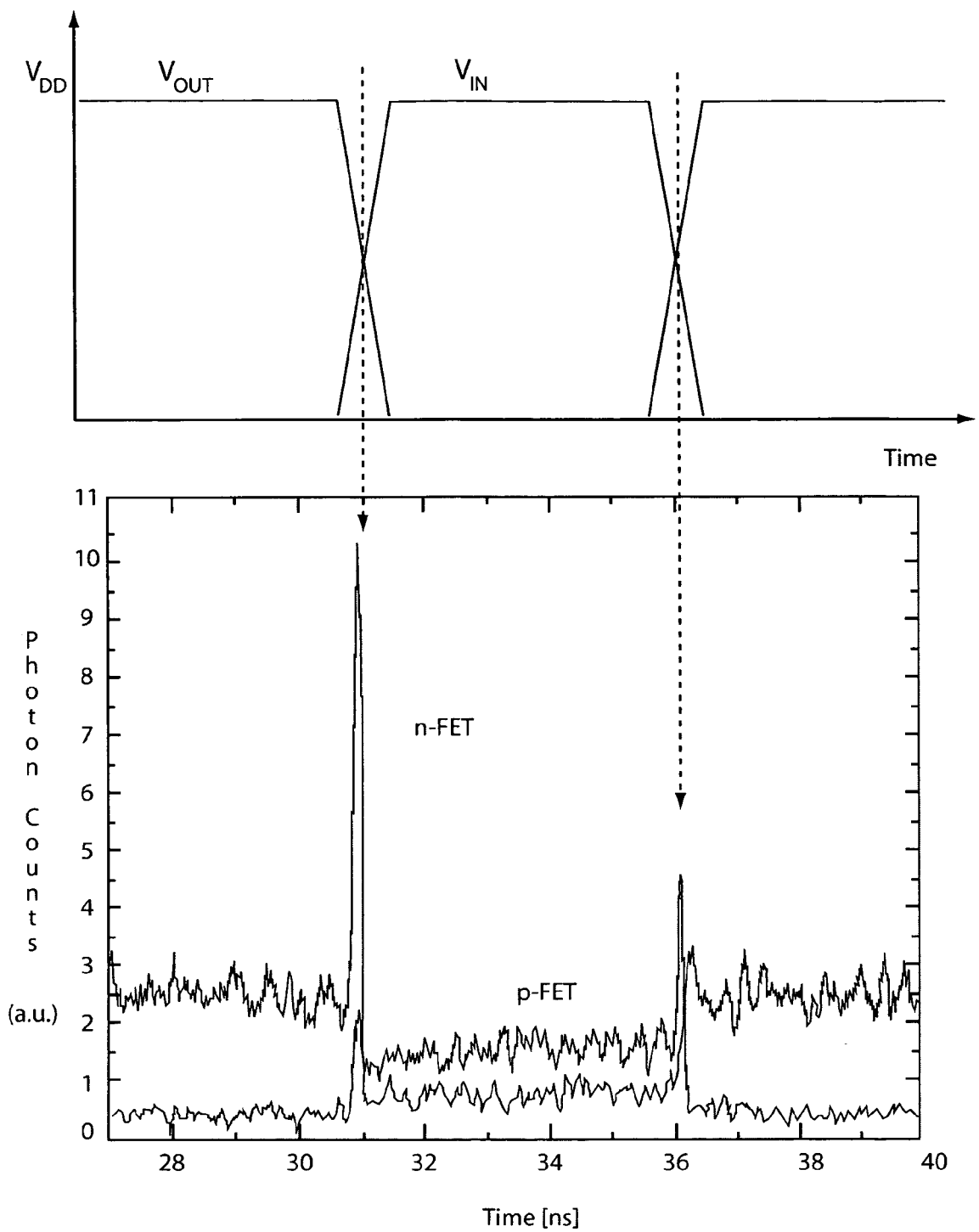
FIG. 9 is a diagram showing optical measurements from an inverter with light emission due to/from off-state leakage current.

Referring to FIG. 9, a measurement of the luminescence emission of the n-FET and p-FET of an inverter gate 100 (FIG. 1) is shown during both a low to high transition (left hand side) and a high to low transition (right hand side) of the input signal in a technology with high leakage current. The time separation between the peaks and the slopes of the transitions from high to low levels (and vice versa) of the photon emission due to off-state leakage current can provide information on the slew rate and the 10%-90% switching transition times of the IN electrical signal.

Having described preferred embodiments of a system and method for estimation of integrated circuit activity using optical measurements (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method for making electrical measurements using optical emissions, comprising:
   positioning a sensor/photodetector to measure radiation emissions from device to be tested;
   collecting radiation emission information from the device to be tested during electrical operation;
   determining characteristic features of the radiation emission information for n-FET and p-FET emissions of the device under test;
   determining differences between the characteristic features; and
   comparing the differences to a model to determine a measurement.

2. The method as recited in claim 1, further comprising the step of selecting a component on the device to be tested.

3. The method as recited in claim 1, further comprising the step of adjusting the sensor to limit light from other sources other than light from the device to be tested.

4. The method as recited in claim 1, wherein the step of determining characteristic features of the radiation emission information includes determining radiation peaks.

5. The method as recited in claim 4, wherein the step of determining differences between the characteristic features includes determining a distance between peaks.

6. The method as recited in claim 5, further comprising the step of analyzing the distance between peaks using the model to determine an electrical property of the device to be tested.

7. The method as recited in claim 6, wherein the electrical characteristic includes slew rate.

8. The method as recited in claim 6, wherein the electrical characteristic includes switching time.

9. The method as recited in claim 6, wherein the model includes a characteristic curve.

10. A program storage device readable by machine, tangibly embodying a program of instructions executable by the machine to perform method steps for making electrical measurements using optical emissions as recited in claim 1.

* * * * *